(12) United States Patent
Liu et al.

(10) Patent No.: US 6,730,174 B2
(45) Date of Patent: May 4, 2004

(54) UNITARY REMOVABLE SHIELD ASSEMBLY

(75) Inventors: Alan B. Liu, Mountain View, CA (US); Ilya Lavitsky, San Francisco, CA (US); Michael Rosenstein, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 46 days.

(21) Appl. No.: 10/093,252

(22) Filed: Mar. 6, 2002

(65) Prior Publication Data

US 2003/0168168 A1 Sep. 11, 2003

(51) Int. Cl.[7] .............................................. C23C 16/00
(52) U.S. Cl. ............... 118/715; 156/345.3; 204/298.11; 118/723 R
(58) Field of Search .................. 204/298.11; 156/345.3; 118/504, 723 R

(56) References Cited

U.S. PATENT DOCUMENTS

| | | | | |
|---|---|---|---|---|
| 4,422,896 A | * | 12/1983 | Class et al. ................... 216/67 |
| 5,419,029 A | | 5/1995 | Raaijmakers ................ 29/447 |
| 5,598,622 A | | 2/1997 | Raaijmakers ................ 29/447 |
| 5,658,442 A | | 8/1997 | Van Gogh et al. ...... 204/298.12 |
| 5,690,795 A | | 11/1997 | Rosenstein et al. ...... 204/192.1 |
| 5,736,021 A | | 4/1998 | Ding et al. ............ 204/298.11 |
| 5,744,016 A | | 4/1998 | Yamada et al. ........ 204/298.11 |
| 5,755,936 A | | 5/1998 | Raaijmakers .......... 204/298.11 |
| 5,879,523 A | * | 3/1999 | Wang et al. ........... 204/298.11 |
| 5,900,103 A | * | 5/1999 | Tomoyasu et al. ..... 156/345.44 |
| 5,948,166 A | * | 9/1999 | David et al. ................ 118/718 |
| 6,030,509 A | * | 2/2000 | Fu-Kang et al. ....... 204/192.12 |
| 6,045,670 A | | 4/2000 | Adams et al. ......... 204/298.11 |
| 6,051,122 A | | 4/2000 | Flanigan ................ 204/298.11 |
| 6,071,572 A | * | 6/2000 | Mosely et al. .............. 427/570 |
| 6,083,360 A | | 7/2000 | Ohlhausen et al. .... 204/192.13 |
| 6,129,808 A | * | 10/2000 | Wicker et al. ........... 156/345.1 |
| 6,149,784 A | | 11/2000 | Su et al. ................ 204/298.11 |
| 6,171,453 B1 | * | 1/2001 | Chung et al. .......... 204/192.12 |
| 6,176,929 B1 | * | 1/2001 | Fukunaga et al. .......... 118/715 |
| 6,190,513 B1 | * | 2/2001 | Forster et al. ......... 204/192.12 |
| 6,287,435 B1 | | 9/2001 | Drewery et al. ....... 204/298.09 |
| 6,296,747 B1 | | 10/2001 | Tanaka .................. 204/298.07 |
| 6,409,896 B2 | * | 6/2002 | Crocker ................. 204/298.03 |
| 2002/0162739 A1 | * | 11/2002 | Bichler et al. ......... 204/298.11 |

FOREIGN PATENT DOCUMENTS

| | | | | |
|---|---|---|---|---|
| EP | 0 747 932 | | 12/1996 | ........... H01L/21/00 |
| EP | 0 836 219 A2 | | 4/1998 | ........... H01J/37/34 |
| EP | 0 853 331 A2 | | 7/1998 | ........... H01J/37/34 |
| EP | 1 091 016 A2 | | 4/2001 | ........... C23C/14/35 |

OTHER PUBLICATIONS

International Search Report, dated Jun. 30, 2003 for PCT/US03/05687.

* cited by examiner

Primary Examiner—P. Hassanzadeh
Assistant Examiner—Karla Moore
(74) Attorney, Agent, or Firm—Moser, Patterson & Sheridan, LLP

(57) ABSTRACT

An apparatus for replacing consumables of a vacuum chamber. A unitary removable shield assembly is provided to quickly replace consumables such as a shield. The shield assembly can include an upper adapter assembly, at least one shield member, a cover ring and an insulator member. The shield assembly is designed so that the consumables can be replaced in one step and allows the chamber to continue with its maintenance cycle.

24 Claims, 2 Drawing Sheets

UNITARY REMOVABLE SHIELD ASSEMBLY

BACKGROUND OF THE INVENTION

1. Field of the Invention

Embodiments of the present invention generally relate to a shield assembly for use in a vacuum chamber.

2. Description of the Related Art

In semiconductor processing, particularly physical vapor deposition, a vacuum chamber is used to deposit materials onto a surface of a substrate that is supported by a substrate support member. A target, typically made of materials such as titanium, aluminum, or copper mounts on a backing plate located in the upper portion of the vacuum chamber that is supplied with an inert gas, such as argon. A DC or RF voltage is applied to the target to generate a plasma in an area between the substrate and the target to produce ions, which bombard the target, and result in the sputtering of target material onto the substrate. However, the target material also deposits on the chamber walls and chamber components, such as the substrate support member, and become a source of contaminants. The target materials can build up and eventually flake off and fall onto the substrate, which can create defects in the substrate.

Conventional methods to clean vacuum chambers include wet cleaning processes and dry cleaning processes using a cleaning gas to react with the deposits. In this method, the deposition process must be discontinued during the cleaning process, and additional time is required for the cleaning materials and by-products to be evacuated from the chamber before the depositing process can resume.

Another conventional method includes using sputtering shields coupled to an adapter ring to prevent sputtering materials from depositing directly onto the chamber wall and other chamber components. A cover ring (shield) can also be provided to protect the substrate support surface from the sputtered materials. The shields are known as "consumables" and require periodic replacement to remove any buildup on them. In order to remove conventional sputtering shields from the adapter ring, other components, such as the insulators, o-rings, and clamp screws have to be disassembled and removed from the vacuum chamber. After the components are disassembled and removed, the used shields are replaced with new shields, and all of the components must be reassembled in the correct order and in the correct alignment to ensure that the vacuum chamber is vacuum-sealed. Thus, there is a significant downtime of the vacuum chamber in order to remove the consumables, replace them, and reassemble the components. With the frequent disassembly and assembly of the components to replace the shields, the screws and the components can rub against each other and generate contaminants in the vacuum chamber and cause defects on the substrate.

Therefore, there is a need for a removable shield assembly that is preferably easy to remove from the processing chamber, requires less substrate processing downtime, and decreases contamination of the chamber.

SUMMARY OF THE INVENTION

The present invention generally relates to a unitary removable shield assembly for use in a semiconductor processing system. The shield assembly can include an upper adapter assembly, at least one shield member affixed to an upper end of the upper adapter assembly, a cover ring detachably positioned on a lower portion of the shield member and an insulator member attached to the upper end of the upper adapter assembly. The upper adapter assembly may be sized to be received by an upper annular wall portion of a vacuum chamber, may be annularly shaped, and may have at least one shoulder configured to secure at least one shield member. The shoulder portion can include at least one nut plate configured to receive shield-securing bolts. The insulator member can include an annularly shaped member manufactured from an electrically insulative material, an annularly shaped dark space shield extending outwardly therefrom, and can be sized to receive a processing target. The at least one shield member may include an outer shield member and an inner shield member concentrically positioned within the outer shield member. The outer shield member can be cylindrically shaped and can include a plurality of radially positioned apertures formed therethrough. The covering ring may include an annularly shaped member having at least one channel formed into an under surface thereof and the channel configured to receive a flange member extending from the lower portion of the at least one shield member. The cover ring can further be configured to engage an outer portion of a substrate support member when the support member is raised into a processing position. The upper adapter assembly, the at least one shield member, the cover ring, and the insulator member can be configured to be removed from the semiconductor processing system as a unitary assembly.

In another embodiment, the unitary removable shield member can include a chamber insulator and an adapter member affixed to and positioned below the chamber insulator, an inner shield member affixed to the adapter member and extending downwardly therefrom, an outer shield member affixed to the adapter member and extending downwardly therefrom, the outer shield member may have at least one hole formed therein to allow process gases to pass therethrough, and a cover ring detachably positioned on a lower portion of at least one of the outer shield member and the inner shield member, the cover ring being configured to engage a periphery portion of a substrate support member when the support member is moved into a processing position. The adapter member can include an annularly shaped member having at least one shoulder member extending inwardly from an inner wall of the adapter member. The shoulder member can also be configured to receive and secure at least one of the chamber insulator, the inner shield member, and the outer shield member thereto. The inner shield may include a cylindrically shaped shield member having an upper flange member extending radially outward therefrom, the upper flange member being configured to attach to the at least one shoulder member. The outer shield member may include a cylindrically shaped shield member having a diameter that is greater than a diameter of the inner shield member, the outer shield member having an upper flange member extending radially outward therefrom, the upper flange member being configured to attach to the at least one shoulder member. The inner shield member may be configured to cover the at least one hole formed into the outer shield member, such that matter deposited onto a substrate positioned within the inner shield does not travel through the at least one hole formed into the outer shield. The cover ring may include an annularly shaped member having a lower surface configured to engage the substrate support member when the substrate support member is moved into the processing position, and engage a lower portion of at least one of the inner shield member and the outer shield member when the substrate support member is moved into a non-processing position. The cover ring can further include an annular grove formed into the lower surface, the annular groove being configured to receive a lower flange portion of at least one of the inner shield member and the outer shield member. The cover ring can also include a shoulder member positioned on an inner periphery portion of the cover ring, the shoulder member being annularly shaped and configured to engage the substrate support member when the substrate support member is moved into the processing position. The chamber insulator, the adapter member, the inner shield member, the outer shield member, and the cover ring are configured to be cooperatively removed from the semiconductor processing system with a unitary lift operation.

In a further embodiment, a physical vapor deposition system is provided and can include a processing chamber having a bottom, a sidewall, and a closable lid member having a physical vapor deposition target positioned on a lower surface of the lid member, a substrate support member positioned in the processing chamber and being configured to support a substrate for processing thereon, the substrate support member being selectively adjustable along a substantially vertical axis; and a unitary shield assembly that may include an insulator configured to electrically isolate the unitary shield member from electrical potentials in the physical vapor deposition system, an adapter member affixed to a lower surface of the insulator, an inner shield member affixed to the adapter member and extending downwardly therefrom, an outer shield member affixed to the adapter member and extending downwardly therefrom, the outer shield member being concentrically positioned outwardly from the inner shield member; and a cover ring detachably positioned on a lower portion of at least one of the outer shield member and the inner shield member, the cover ring being configured to engage a periphery portion of the substrate support member when the substrate support member is moved into a processing position. The outer shield member also include at least one hole formed therein, the at least one hole being configured to allow a process gas to travel therethrough toward an interior portion of the physical vapor deposition system.

BRIEF DESCRIPTION OF THE DRAWINGS

So that the manner in which the above recited embodiments of the present invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention, and are therefore, not to be considered limiting of its scope, for the invention may admit to other equally effective embodiments.

DETAILED DESCRIPTION OF THE PREFERRED EMBODIMENT

Figure 1:
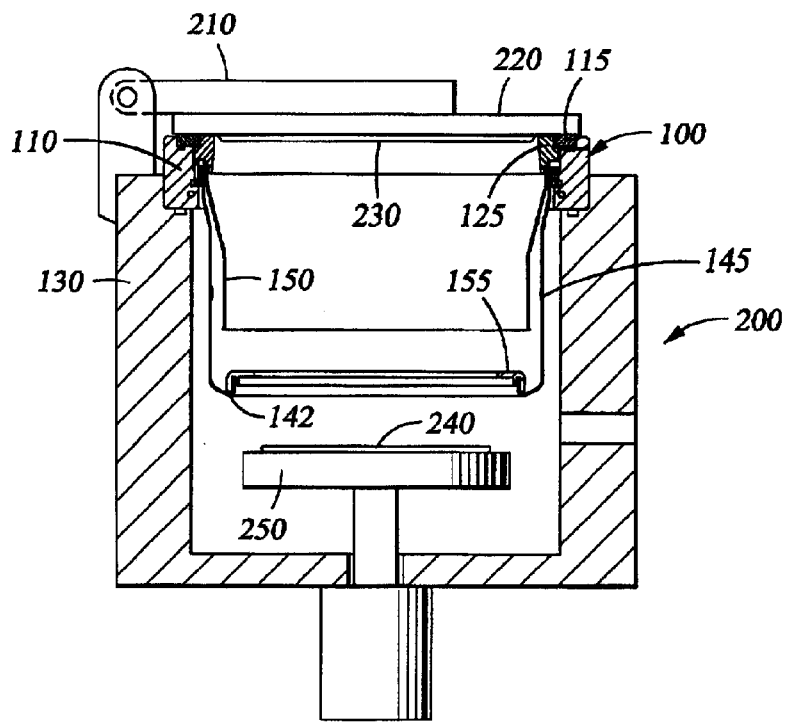
FIG. 1 is a cross-sectional view of a removal shield assembly disposed in a vacuum chamber.

FIG. 1 is a cross-sectional view of a removable shield assembly 100 disposed in a vacuum chamber 200. The shield assembly 100 can include an upper adapter 110 disposed on a wall 130 of a conventional physical vapor deposition chamber (PVD chamber) 200. The upper adapter 110 is constructed and arranged to mate with any vacuum chamber, including the PVD chamber 200, and is secured to the wall 130 by bolts or screws (not shown). The upper portion of the chamber 200 includes a lid 210 that has a target 230 on a backing plate 220. The lower portion of the chamber 200 includes a substrate 240 disposed on a substrate support member 250.

Figure 2:
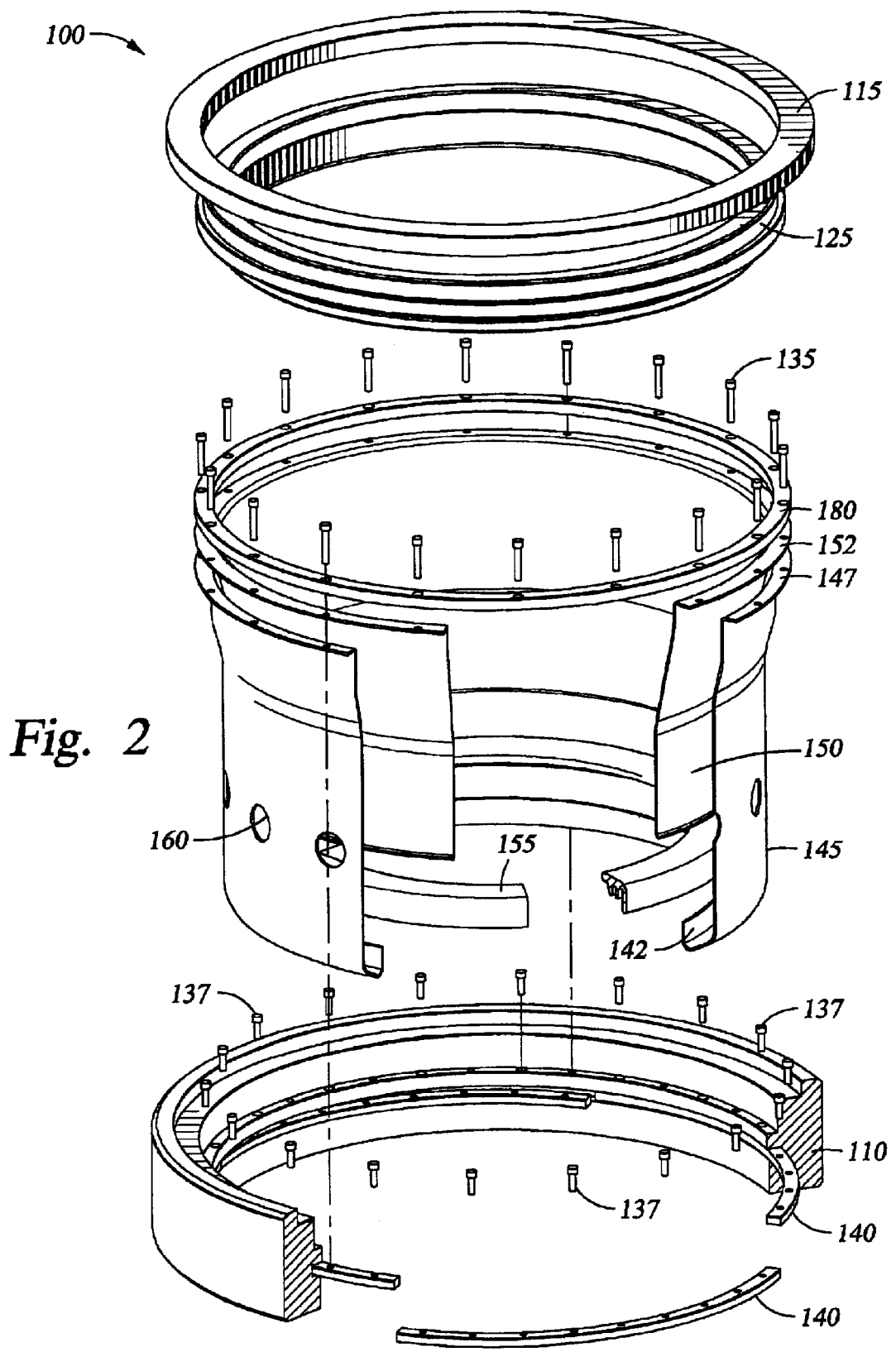
FIG. 2 is exploded partial cross-section view of the shield assembly.

The shield assembly 100, which is further illustrated in FIG. 2, can further include a chamber insulator 115 and one or more consumable, such as an outer shield 145, an inner shield 150, a dark space shield 125, and a cover ring 155. The outer shield 145 is designed to shield the chamber wall 130 from the sputtered material. The outer shield 145 is generally annular in shape, includes holes 160 to allow process gases to circulate within the vacuum chamber 200. A flange 147 (See FIG. 2) at a first end is retained by a clamp ring 180 (See FIG. 2), and a flange 142 at a second end to receive the cover ring 155. The inner shield 150 is designed to shield the chamber wall 130 from the sputtered material during substrate processing and prevents sputtered material from traveling through holes 160. The inner shield 150 is also annular in shape and is typically smaller in diameter and length than the outer shield 145. The dark space shield 125 is annularly shaped and prevents sputtered material from being deposited on the backing plate 220. The cover ring 155 protects the substrate support member 250 from being covered with sputtered materials during substrate processing. Prior to processing, the substrate support member 250 moves the substrate 240 upwards into a processing position within the inner shield 150. As the substrate support member 250 moves upwards, it picks up cover ring 155 from the flange 142 and the cover ring 155 remains on the support member 250 during processing. After processing, the support member 250 moves down and the flange 142 captures and holds the cover ring 145 until the next substrate 240 is moved into the processing position.

FIG. 2 is an exploded partial cross-section view of the shield assembly 100. A chamber insulator 115 seats on a shoulder of the upper adapter 110. The dark space shield 125 seats on the clamp ring 180. The clamp ring 180 and the clamping screws 135 clamp a flange 152 of an inner shield 150 and a flange 147 of an outer shield 145 onto a nut plate 140 that is secured to the upper adapter 110. The nut plate 140 can be secured to the upper adapter 110 by screws 137. Although not shown, o-rings are also included to seal the different parts of the shield assembly 100 for processing in a vacuum.

In an alternative embodiment, the shield assembly 100 can include one or any combination of the inner shield, outer shield, dark space shield, the cover ring or any other component that can act as a shield. The shield assembly 100 can be designed and constructed to have as many shields as needed to protect the chamber 200 and its components from the deposits of target material.

Figure 3:
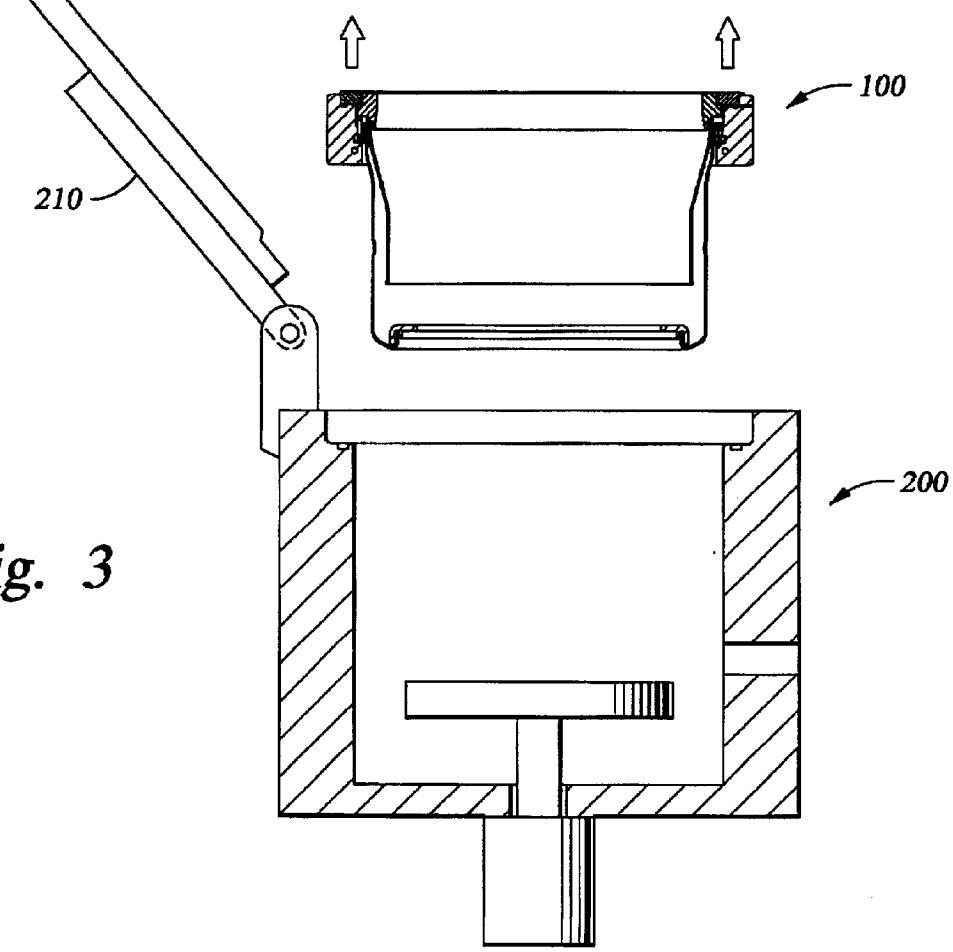
FIG. 3 illustrates the shield assembly being removed from the chamber.

FIG. 3 illustrates the shield assembly 100 being removed from the chamber 200. The lid 210 moves for easy access to the shield assembly 100. The bolts that secure the upper adapter 110 to the chamber wall 130 are removed so that shield assembly 100 can be removed manually or with a lifting aid. After the shield assembly 100 is removed from the vacuum chamber 200, it can quickly be replaced with another shield assembly 100. The lid 210 is then closed and sealingly secured by conventional means against the chamber insulator 115 and the periodic maintenance cycle can proceed. While the vacuum chamber 200 proceeds to the next steps of the periodic maintenance cycle such as pump down, bake-out or burn-in, the used shield assembly 100 can be disassembled on a near-by workbench, where the shield assembly 100 is more ergonomically accessible. The components of the shield assembly 100 can be disassembled away from the chamber, whereby any contaminants that may be produced will not contaminate the vacuum chamber 200. Additionally, the consumables such as the inner shield 150, the outer shield 145, the cover ring 155, and the dark space shield 125 can be replaced and other components of the shield assembly 100 can be maintenance while the chamber 200 is continuing with the next step in its maintenance. After the consumables are replaced, the replacement shield assembly 100 is ready for use in the next periodic maintenance of the vacuum chamber 200.

By using the shield assembly 100, the chamber 200 is allowed to continue with its maintenance while the consumables are replaced, instead of having to wait for the consumables to be replaced in the chamber itself. Thus, the maintenance time of the chamber 200 is decreased and downtime of the chamber is minimized. Additionally, because the shield assembly 100 is unitary, many shield assemblies 100 can be assembled ahead of time and are ready for use.

While the foregoing is directed to embodiments of the present invention, other and further embodiments of the invention may be devised without departing from the basic scope thereof, and the scope thereof is determined by the claims that follow.

What is claimed is:

1. A removable shield assembly for a semiconductor processing system, comprising:
   an upper adapter assembly adapted for removably mounting said shield assembly to a wall of said processing system;
   at least one shield member affixed at an upper end thereof to the upper adapter assembly;
   a cover ring detachably positioned on a lower portion of the at least one shield member; and
   an insulator member attached to the upper end of the upper adapter assembly,
   wherein the upper adapter assembly, the at least one shield member, the cover ring and the insulator are simultaneously removable as a unitary assembly.

2. The removable shield member of claim 1, wherein the upper adapter assembly is sized to be received by an upper annular wall portion of a vacuum chamber.

3. The removable shield member of claim 2, wherein the upper adapter assembly comprises an annularly shaped member having at least one shoulder portion configured to secure the at least one shield member thereto.

4. The removable shield member of claim 3, wherein the at least one shoulder portion further comprises at least one nut plate configured to receive shield securing bolts therethrough.

5. The removable shield member of claim 1, wherein the insulator member comprises an annularly shaped member manufactured from an electrically insulative material, the annularly shaped member being sized to receive a processing target in an interior region thereof.

6. The removable shield member of claim 5, wherein the insulator member further comprises an annularly shaped dark space shield extending outwardly therefrom.

7. The removable shield member of claim 1, wherein the at least one shield member comprises:
   an outer shield member; and
   an inner shield member concentrically positioned within the outer shield member.

8. The removable shield member of claim 7, wherein the outer shield member is cylindrical in shape and includes a plurality of radially positioned apertures formed therethrough.

9. The removable shield member of claim 1, wherein the cover ring further comprises an annularly shaped member having at least one channel formed into an under surface thereof, the at least one channel being configured to receive a flange member extending from the lower portion of the at least one shield member.

10. The removable shield member of claim 9, wherein the cover ring is configured to engage an outer portion of a substrate support member when the substrate support member is raised into a processing position.

11. The removable shield member of claim 1, wherein the upper adapter assembly, the at least one shield member, the cover ring, and the insulator member are configured to be cooperatively removed from the semiconductor processing system as a unitary assembly.

12. A unitary removable shield member for a semiconductor processing system, comprising:
   a chamber insulator;
   an adaptor member affixed to the chamber insulator such that the adapter member is positioned below the chamber insulator, the adapter member being adapted for removably mounting said shield member to a wall of said processing system;
   an inner shield member affixed to the adapter member and extending downwardly therefrom;
   an outer shield member affixed to the adapter member and extending downwardly therefrom, the outer shield member having at least one hole formed therein to allow process gasses to pass therethrough; and
   a cover ring detachably positioned on a lower portion of at least one of the outer shield member and the inner shield member, the cover ring being configured to engage a periphery portion of a substrate support member when the substrate support member is moved into a processing position,
   wherein the chamber insulator, the adapter member, the inner shield member, the outer shield member and the cover ring are simultaneously removable as a unitary assembly.

13. The unitary removable shield member of claim 12, wherein the adapter member comprises an annularly shaped member having at least one shoulder member extending inwardly from an inner wall of the adapter member.

14. The unitary removable shield member of claim 13, wherein the at least one shoulder member is configured to receive and secure at least one of the chamber insulator, the inner shield member, and the outer shield member thereto.

15. The unitary removable shield member of claim 13, wherein the inner shield comprises a cylindrically shaped shield member having an upper flange member extending radially outward therefrom, the upper flange member being configured to attach to the at least one shoulder member.

16. The unitary removable shield member of claim 13, wherein the outer shield member comprises a cylindrically shaped shield member having a diameter that is greater than a diameter of the inner shield member, the outer shield member having an upper flange member extending radially outward therefrom, the upper flange member being configured to attach to the at least one shoulder member.

17. The unitary removable shield member of claim 12, wherein the inner shield member is configured to cover the at least one hole formed into the outer shield member, such that matter deposited onto a substrate positioned within the inner shield does not travel through the at least one hole formed into the outer shield.

18. The unitary removable shield member of claim 12, wherein the cover ring comprises an annularly shaped member having a lower surface configured to engage the substrate support member when the substrate support member is moved into the processing position and to engage a lower portion of at least one of the inner shield member and the outer shield member when the substrate support member is moved into a non-processing position.

19. The unitary removable shield member of claim 18, wherein the cover ring includes an annular grove formed into the lower surface, the annular groove being configured to receive a lower flange portion of at least one of the inner shield member and the outer shield member.

20. The unitary removable shield member of claim 18, wherein the cover ring includes a shoulder member positioned on an inner periphery portion of the cover ring, the shoulder member being annularly shaped and configured to engage the substrate support member when the substrate support member is moved into the processing position.

21. The unitary removable shield member of claim 12, wherein the chamber insulator, the adapter member, the inner shield member, the outer shield member, and the cover ring are configured to be cooperatively removed from the semiconductor processing system with a unitary lift operation.

22. The removable shield assembly of claim 1, wherein the at least one shield member comprises:

an inner shield member affixed to the upper adapter assembly and extending downwardly therefrom;

an outer shield member affixed to the upper adapter assembly and extending downwardly therefrom, wherein the outer shield member is positioned radially outward of the inner shield member; and an annular dark space shield extending outwardly from the insulator member.

23. The unitary removable shield member of claim 12, further comprising:

an annular dark spaced shield extending outwardly from the chamber insulator.

24. A removable shield assembly for a semiconductor processing system, comprising:

an upper adapter assembly adapted for removably mounting said shield assembly to a wall of said processing system, the adapter assembly having an inner surface comprising a shoulder;

an insulator member positioned to rest upon the shoulder of the upper adapter assembly;

an inner shield member affixed to the inner surface of the upper adapter assembly and extending downwardly therefrom;

an outer shield member affixed to the inner surface of the upper adapter assembly and extending downwardly therefrom, wherein the outer shield member is positioned radially outward of the inner shield member; and an annular dark space shield extending radially inward from the insulator member; and a cover ring detachably positioned on a lower portion of at least one of the inner or outer shield members;

wherein the upper adapter assembly, the insulator member, the inner shield member, the outer shield member, the dark space shield and the cover ring are simultaneously removable as a unitary assembly.

* * * * *

UNITED STATES PATENT AND TRADEMARK OFFICE
CERTIFICATE OF CORRECTION

PATENT NO. : 6,730,174 B2
DATED : May 4, 2004
INVENTOR(S) : Liu et al.

It is certified that error appears in the above-identified patent and that said Letters Patent is hereby corrected as shown below:

Column 7,
Line 13, please change "grove" to -- groove --.

Signed and Sealed this

Fifteenth Day of February, 2005

JON W. DUDAS
*Director of the United States Patent and Trademark Office*